US012444580B2

(12) United States Patent
Chen et al.

(10) Patent No.: US 12,444,580 B2
(45) Date of Patent: Oct. 14, 2025

(54) PLASMA PROCESSING APPARATUS AND METHOD

(71) Applicant: Taiwan Semiconductor Manufacturing Company, Ltd., Hsinchu (TW)

(72) Inventors: Chih-Hao Chen, Hsinchu (TW); Chung Chuan Huang, Hsinchu (TW); Yi-Tsang Hsieh, Hsinchu (TW); Yu-Chi Lin, Hsinchu (TW); Cha-Hsin Chao, Taipei (TW); Che-En Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 277 days.

(21) Appl. No.: 18/323,769

(22) Filed: May 25, 2023

(65) Prior Publication Data

US 2024/0395508 A1 Nov. 28, 2024

(51) Int. Cl.
*H01J 37/32* (2006.01)

(52) U.S. Cl.
CPC .. *H01J 37/32642* (2013.01); *H01J 37/32027* (2013.01); *H01J 37/32458* (2013.01); *H01J 37/32651* (2013.01); *H01J 37/32715* (2013.01); *H01J 2237/334* (2013.01)

(58) Field of Classification Search
CPC .......... H01J 37/32642; H01J 37/32027; H01J 37/32458; H01J 37/32651; H01J 37/32715; H01J 2237/334
See application file for complete search history.

(56) References Cited

U.S. PATENT DOCUMENTS

| | | | | |
|---|---|---|---|---|
| 2009/0229759 A1* | 9/2009 | Ogasawara ....... | H01J 37/32642 |
| | | | 156/345.51 |
| 2021/0280396 A1* | 9/2021 | Matsuura .......... | H01J 37/32715 |
| 2024/0395508 A1* | 11/2024 | Chen ................ | H01J 37/32027 |

FOREIGN PATENT DOCUMENTS

| | | | |
|---|---|---|---|
| TW | I272877 B * | 2/2007 | ........ H01J 37/32642 |
| TW | 202447753 A * | 12/2024 | ........ H01J 37/32715 |
| TW | I869012 B * | 1/2025 | ........ H01J 37/32715 |

* cited by examiner

*Primary Examiner* — Jeffrie R Lund
(74) *Attorney, Agent, or Firm* — Ingrassia Fisher & Lorenz, LLP

(57) ABSTRACT

A semiconductor manufacturing apparatus for performing a process is disclosed. An apparatus includes a chamber configured to receive a wafer for an etching process; a conductive focus ring disposed within the chamber and configured to focus an electric field to control an etch direction of the etching process; and an insulative cover ring disposed within the chamber, wherein the insulative cover ring is configured to modify the electric field, wherein the insulative cover ring has an inner annular insulative portion and outer annular insulative portion, and wherein a gap is defined between the inner annular insulative portion and the outer annular insulative portion.

20 Claims, 7 Drawing Sheets

FIG. 2
S210: Determine overlap shift and/or via tilting
S220: Design Cover Ring
S230: Install Cover Ring
S240: Position Wafer on Chuck
S250: Apply Plasma
S261: Apply Bias to Focus Ring
S262: Modify Electrical Field of Focus Ring
S260

PLASMA PROCESSING APPARATUS AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
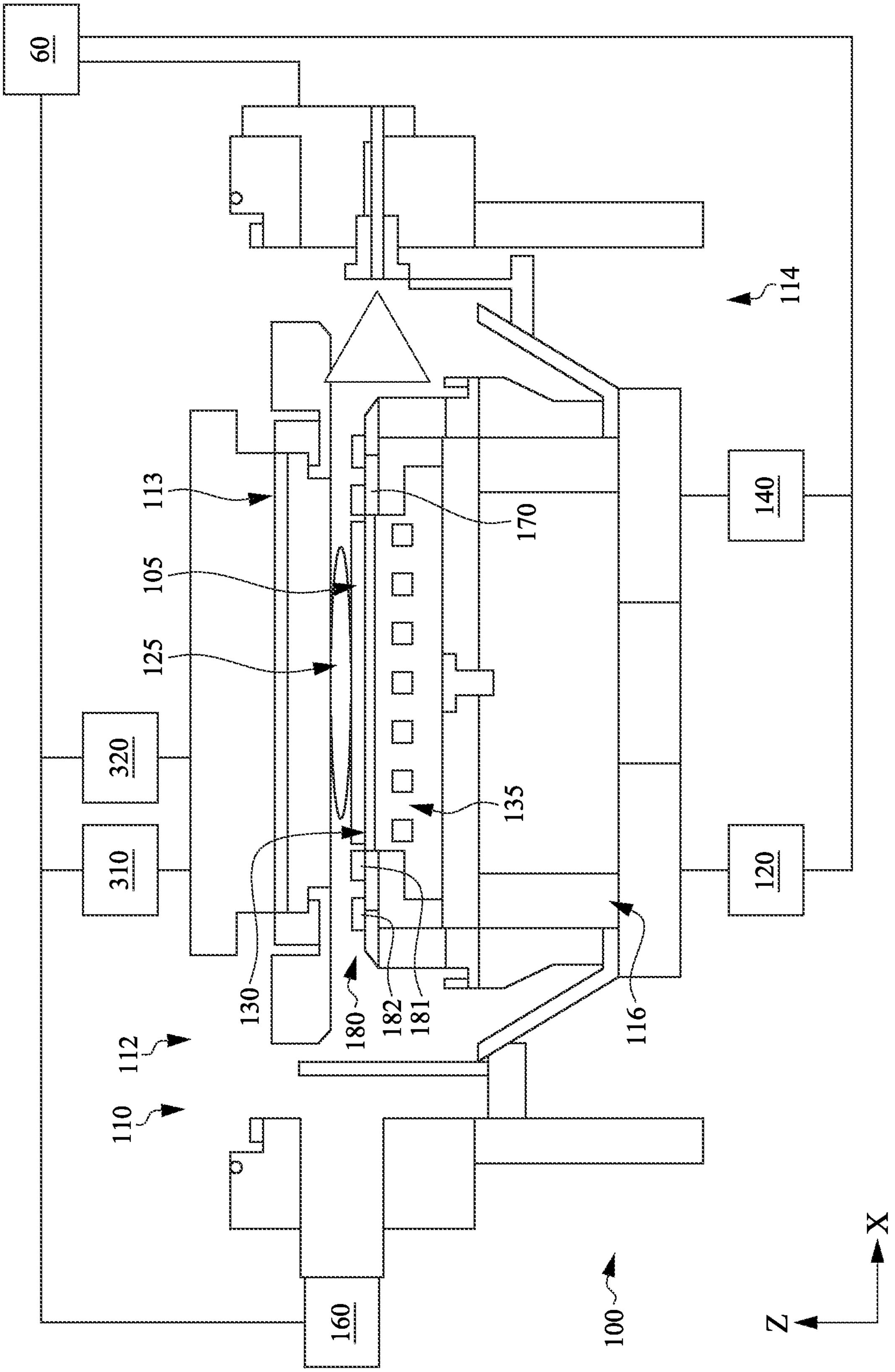
FIG. 1 is a view of a semiconductor processing apparatus according to embodiments of the present disclosure.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about" and "substantially," and the like may be used herein for case of description. A person having ordinary skill in the art will be able to understand and derive meanings for such terms. For example, "about" may indicate variation in a dimension of 20%, 10%, 5%, or the like, but other values may be used when appropriate. A large feature, such as the longest dimension of a semiconductor fin may have variation less than 5%, whereas a very small feature, such as thickness of an interfacial layer may have variation of as much as 50%, and both types of variation may be represented by the term "about." "Substantially" is generally more stringent than "about," such that variation of 10%, 5% or less may be appropriate, without limit thereto. A feature that is "substantially planar" may have variation from a straight line that is within 10% or less. A material with a "substantially constant concentration" may have variation of concentration along one or more dimensions that is within 5% or less. Again, a person having ordinary skill in the art will be able to understand and derive appropriate meanings for such terms based on knowledge of the industry, current fabrication techniques, and the like.

In certain embodiments herein, a "material layer" is a layer that includes at least 50 wt. % of the identified material, for example at least 60 wt. % of the identified material, at least 75 wt. % of the identified material, or at least 90 wt. % of the identified material, or substantially 100 wt. % of the identified material; and a layer that is a "material" includes at least 50 wt. % of the identified material, for example at least 60 wt. % of the identified material, at least 75 wt. % of the identified material, or at least 90 wt. % of the identified material, or substantially 100 wt. % of the identified material. For example, certain embodiments, each of a titanium nitride layer and a layer that is titanium nitride is a layer that is at least 50 wt. %, at least 60 wt. %, at least 75 wt. %, titanium nitride, or at least 90 wt. %, or substantially 100 wt. %, titanium nitride.

Semiconductor fabrication generally involves the formation of electronic circuits by performing multiple depositions, etchings, annealing processes, and/or implantations of material layers, whereby a stack structure including many semiconductor devices and interconnects between is formed. Dimension scaling (down) is one technique employed to fit ever greater numbers of semiconductor devices in the same area. However, dimension scaling is increasingly difficult in advanced technology nodes.

An apparatus for processing a semiconductor wafer for fabrication of a semiconductor device is described in accordance with various embodiments. In particular, the apparatus may be an etching apparatus, such as a plasma etching apparatus. Plasma etching of a semiconductor wafer or workpiece often uses reactive gases including a chlorine or fluorine etching chemistry for etching silicon, dielectrics, and metals. During etching, the reactive gases are excited by a high frequency electromagnetic field resulting in an etching plasma comprising ions that bombard the surface of the semiconductor workpiece.

In certain embodiments, the plasma etching apparatus includes a conductive focus ring to direct the plasma towards the wafer and ensure that the plasma is evenly distributed over the wafer. Specifically, a conductive focus ring will generate or focus an electric field to control an etch direction of the plasma ions.

Plasma etchers may exhibit a tilting angle problem near the wafer edge, particularly when the plasma etching process is carried out for a long time and at high RF (radio frequency) power. This problem can result in non-uniform etching of the wafer, which can affect the quality and yield of the fabricated devices. The tilting angle problem occurs due to the non-uniform distribution of the electric field near the edge of the wafer. The electric field is strongest at the center of the electrode and decreases towards the edge of the electrode. This can cause a difference in the etching rate between the center and the edge of the wafer, resulting in a tilted profile. At high RF hours, the problem becomes more severe because the electric field is amplified, causing the wafer to heat up and deform. The deformation of the wafer can further aggravate the non-uniform distribution of the electric field, leading to an even greater tilting angle problem.

In certain embodiments, the focus ring surrounding the wafer may be equipped with direct current (DC) power. While application of DC power through the focus ring may reduce the tilting angle problem, there remains a via-to-metal overlap shifting at the wafer radius of 130 to 145 millimeters (of a wafer having a radius of 150 mm).

Embodiments herein reduce or eliminate the tilting angle problem and the via-to-metal overlap at the wafer radius of 130 to 145 mm. Specifically, in an embodiment herein, an insulative cover ring is located over the conductive focus ring. The insulative cover ring includes an inner annular portion or shield that lies directly over the inner edge of the focus ring. Further, the insulative cover ring includes an outer annular portion or shield that lies direction over the outer edge of the focus ring. An annular gap or opening is formed in the cover ring between the inner annular portion and the outer annular portion. The central annular gap lies directly over a central annular portion of the focus ring. As a result, the insulative cover ring is configured to modify the electric field focused by the focus ring. As modified by the cover ring, the focus ring exposure area affects the plasma sheath thickness and influences the ion incident angle toward the wafer. Thus, wafer edge profile tilting may be solved and the via-to-metal overlap may be reduced or eliminated.

Further, in certain embodiments, the dimensions of the inner annular portion and outer annular portion of the cover ring may be easily modified to adjust the plasma sheath near the wafer edge as desired. For example, the radial widths of the inner annular portion, the annular gap, and the outer annular portion may be modified. Also, the cross-sectional profile of the inner annular portion and the outer annular portion may be modified, including the height of the inner and/or outer sidewall of both the inner annular portion and the outer annular portion, as well as the angles between the sidewall surfaces and top surfaces. In certain embodiments the cross-sectional profile of the inner annular portion and the outer annular portion may be a regular polygon, an irregular polygon, a concave polygon, and/or a staircase polygon, and in certain embodiments may have the shape of such a polygon but be formed with a curved side or sides.

FIG. 1 is a schematic view of a semiconductor processing apparatus 100, according to various embodiments of the disclosure. In some embodiments, the semiconductor processing apparatus 100 is configured for performing etching, deposition, or other suitable process.

As shown in FIG. 1, the semiconductor processing apparatus 100 includes a process chamber 110, and a source of radio frequency (RF) power 120 configured to provide RF power in the process chamber 110. The semiconductor processing apparatus 100 also includes an electrostatic chuck 130 within the process chamber 110, and the electrostatic chuck 130 is configured to receive and secure a wafer 105. The semiconductor processing apparatus 100 also includes a chuck electrode 135, and a source of direct current (DC) power 140 connected to the chuck electrode 135. The source of DC power 140 is configured to provide power to the chuck electrode 135. The semiconductor processing apparatus 100 also includes a gas source 310 configured to introduce process and/or carrier gases into the process chamber 110. The semiconductor processing apparatus 100 may further includes a flow verification unit 320 configured to measure and/or verify flow rate of the process and/or carrier gases into the process chamber 110.

In certain embodiments, the semiconductor processing apparatus 100 is an etching apparatus 100, such as a plasma etching apparatus 100. In some embodiments, the semiconductor processing apparatus 100 is any plasma etching or dry etching tool that produces a plasma from a process gas, typically oxygen, chlorine-bearing gas, or fluorine-bearing gas, and uses a radio frequency (RF) electric field. In some embodiments, the semiconductor processing apparatus 100 is an ion-beam etcher, reactive ion etcher, or the like. In other embodiments, instead of an etching apparatus, the semiconductor processing apparatus 100 is a plasma deposition apparatus, such as a plasma-enhanced atomic layer deposition (PEALD) apparatus or the like. The plasma etching apparatus and the plasma deposition apparatus may be collectively referred to as plasma processing apparatuses.

In some embodiments, the wafer 105 includes a single crystalline semiconductor layer on at least its surface. In some embodiments, the wafer 105 includes a single crystalline semiconductor material such as, but not limited to Si, Ge, SiGe, GaAs, InSb, GaP, GaSb, InAlAs, InGaAs, GaSbP, GaAsSb, and InP. In some embodiments, the wafer 105 is made of Si. In some embodiments, the wafer 105 is a silicon wafer. In some embodiments, the wafer 105 is a semiconductor-on-insulator substrate fabricated using separation by implantation of oxygen (SIMOX), wafer bonding, and/or other suitable methods, such as a silicon-on-insulator (SOI) substrate, a silicon germanium-on-insulator (SGOI) substrate, or a germanium-on-insulator (GOI) substrate. In some embodiments, the wafer 105 is a Si wafer having a mirror polished surface on one side or both sides. In some embodiments, the wafer 105 includes one or more integrated circuit (IC) dies in an intermediate (unfinished) stage of fabrication, such that plasma etching or deposition is performed on at least a topmost layer of each of the IC dies by the semiconductor processing apparatus 100.

In some embodiments, the process chamber 110 includes an upper portion 112 and a lower portion 114, which may include at least one conductive material, such as aluminum, as well as other non-conductive or semiconductive materials. The upper portion 112 includes an upper electrode 113, in some embodiments. In some embodiments, the lower portion 114 includes an insulating ceramic frame 116 and includes the electrostatic chuck 130 within the insulating ceramic frame 116. For example, the electrostatic chuck 130 is disposed within the insulating ceramic frame 116 within the lower portion 114 of the process chamber 110, as shown in FIG. 1. In some embodiments, the electrostatic chuck 130 includes a conductive sheet, which serves as the chuck electrode 135. In some embodiments, the conductive sheet includes at least two sheet portions which are electrically isolated from each other. As shown in FIG. 1, the chuck electrode 135 is connected to the source of DC power 140. When a DC voltage from the source of DC power 140 is applied to the chuck electrode 135 of the electrostatic chuck 130 having the wafer 105 disposed thereon, a Coulomb force is generated between the wafer 105 and the chuck electrode 135. The Coulomb force attracts and holds the wafer 105 on the electrostatic chuck 130 until the application of the DC voltage from the source of DC power 140 is discontinued. In some embodiments, at least one DC voltage is applied to the at least two sheet portions of the chuck electrode 135 by the source of DC power 140.

In some embodiments, in order to improve the heat transfer between the wafer 105 and the electrostatic chuck 130, one or more gases, such as He or Ar, is introduced between the wafer 105 and the electrostatic chuck 130 by the gas source 310. In some embodiments, the gas dissipates heat generated between the wafer 105 and the electrostatic chuck 130 during the application of the DC voltage.

As illustrated in FIG. 1, the semiconductor processing apparatus 100 also includes a pump 160 connected to the process chamber 110. The pump 160 is configured to provide a vacuum or maintain a certain gas pressure within the process chamber 110. In some embodiments, the pressure within the process chamber 110 is maintained by the combination of the gas or gases being introduced by the gas source 310 and a level of pumping performed by the pump 160. In some embodiments, the pressure within the process chamber 110 is maintained solely by pumping with the pump 160.

In some embodiments, the source of RF power 120 is turned on to apply a plasma 125 for plasma etching operations. The source of RF power 120 may be configured to generate an RF signal operating at a set frequency (e.g., 13.56 MHz), which transfers energy from the source of RF power 120 to the gas within the process chamber 110. When sufficient power has been delivered to the gas, a plasma is ignited. In some embodiments, the power applied during the etching operations ranges from about 200 watts to about 700 watts. In some embodiments, application of an RF pulse occurs for a duration of about 10 seconds to about 60 seconds.

In some embodiments, the semiconductor processing apparatus 100 further includes a focus ring 170. The focus ring 170 surrounds at least a portion of the electrostatic chuck 130 and/or the wafer 105 and may have a generally annular shape. Along a vertical radial plane, such as the plane of the drawing sheet, the focus ring 170 may have a rectangular cross-section, as shown in FIG. 1, or may have an irregular cross-section or a cross-section of a different shape, such as the shape of a regular polygon, an irregular polygon, a concave polygon, and/or a staircase polygon, and in certain embodiments may have the shape of such a polygon but be formed with a curved side or sides. The focus ring 170 may have a vertical thickness, i.e., a thickness in the direction of the Z-axis, of from 2.5 mm to 50 mm. However, any suitable dimensions or suitable shapes may be used.

The focus ring 170 may be made of a conductive material, a metal material, a semiconductor material, or another material. In some embodiments, the focus ring 70 may be made of doped or undoped silicon.

In some embodiments, the focus ring 170 may be coupled to the source of DC power 140. For example, at least one DC voltage is applied to the focus ring 170 by the source of DC power 140, such that the focus ring 170 may be electrically biased by the DC power source 140 at a DC voltage during the etching process.

As further shown in FIG. 1, the semiconductor processing apparatus 100 also includes a cover ring 180. In certain embodiments, the cover ring 180 includes an inner annular portion or shield 181 and an outer annular portion or shield 182. Each portion 181 and 182 of the cover ring 180 may be made of an insulative material able to survive high temperature and hostile environments, for example, a ceramic material such as quartz, alumina, silicon nitride, or other suitable material. The annular portions 181 and 182 may be made of a same material, or may be made of different materials.

In exemplary embodiments, each annular portion 181 and 182 may independently have a rectangular cross-section as shown in FIG. 1, or each may independently have an irregular cross-section or a cross-section of a different shape, such as the shape of a regular polygon, an irregular polygon, a concave polygon, and/or a staircase polygon, and in certain embodiments each may independently have the shape of such a polygon but be formed with a curved side or sides.

As described below, the annular portions 181 and 182 may be separated pieces that are disconnected, or may be connected pieces. For example, a bridge portion or bridge portions (not shown in FIG. 1) may interconnect the annular portions 181 and 182.

In some embodiments, the cover ring 180 may be utilized for achieving a more uniform plasma distribution over the entire surface of the wafer 105 and for restricting the distribution of the plasma cloud to only the wafer surface area.

Operations of various components of the processing apparatus 100 may be controlled by a controller 60 connected to the components, for example, by one or more wired connections and/or wireless connections. The wired connections may be electrical, optical, or another suitable connection type. The wireless connections may be by electrical antennae, optical receivers, or other suitable wireless connection types. In some embodiments, the controller 60 is connected to one or more of the source of RF power 120, the source of DC power 140, the pump 160, the gas source 310 and the flow verification unit 320 for controlling operations thereof.

Although the semiconductor processing apparatus 100 may be described above as a capacitively coupled plasma generator, embodiments are not intended to be limited to a capacitively coupled plasma generator. Rather, any suitable method of generating the plasma, such as inductively coupled plasma systems, magnetically enhanced reactive ion etching, electron cyclotron resonance, a remote plasma generator, or the like, may be utilized. All such methods are fully intended to be included within the scope of the embodiments.

Although a number of particular parts of the semiconductor processing apparatus 100 have been described above, other suitable parts may also be included. For example, endpoint mounts, liners, and any other parts that may help operate or control the etching process may also be included. All such parts are fully intended to be included within the scope of the embodiments.

Figure 2:
FIG. 2 is a flow chart illustrating a method for processing a semiconductor according to embodiments of the present disclosure.

FIG. 2 illustrates a method 200 for etching a wafer 10.

As shown, method 200 includes, at operation S210, determining a via-to-metal overlap shift due to via tilting of an etching process, such as a plasma etching process using a focus ring 170. Further, method 200 includes, at operation S220, determining a design of a cover ring 180 to modify the electrical field of the focus ring 170 to reduce or eliminate the via-to-metal overlap shift due to via tilting. Also, method 200 includes, at operation S230 installing a cover ring 180 with the appropriate design over and/or around the focus ring 170.

As shown, method 200 includes, at operation S240, positioning the wafer 105 on the electrostatic chuck 130. The wafer 105 may be secured in place by the electrostatic chuck 130. For example, the semiconductor wafer may be clamped by electrostatic force on the electrostatic chuck in a single stage wherein the entire semiconductor wafer is clamped simultaneously. Alternatively, the electrostatic force may be applied gradually in a staggered manner over the area of the semiconductor wafer and the electrostatic chuck.

Further, method 200 includes applying a plasma 125 at operation S250. For example, the apparatus 100 is operated to introduce the desired etchants into the chamber 110 and to ignite them into the plasma 125 through application of RF power. The source of RF power 120 may be configured to generate an RF signal operating at a set frequency (e.g., 13.56 MHz), which transfers energy from the source of RF power 120 to the etchant gas within the process chamber 110. When sufficient power has been delivered to the gas, a plasma is ignited. In some embodiments, the power applied during the etching operations ranges from about 200 watts to about 700 watts. In some embodiments, application of an RF pulse occurs for a duration of about 10 seconds to about 60 seconds.

At operation S260, method 200 includes focusing the plasma 125 with the focus ring 170 and the cover ring 180 to achieve a more uniform plasma distribution over the entire surface of the wafer 105 and to restrict the distribution of the plasma cloud to only the wafer surface area.

Specifically, operation S260 includes, at operation S261, providing an electrical bias, from the DC power source 140, to the focus ring 170 to maintain the plasma during the etching process by maintaining the bias and to help accelerate ions from the plasma towards the semiconductor wafer 105. For example, the biased focus ring 170 focuses an electric field to control an etch direction of the etching process.

Simultaneously with operation S261, operation S260 includes, at operation S262, modifying the electric field with the cover ring 180. Specifically, the insulative cover ring 180 blocks or weakens the electric field focused by the focus ring 170 to affect the sheath of plasma 125.

Because the cover ring 180 may be designed and installed in an existing semiconductor processing apparatus 100 over and/or around an existing focus ring 170, a semiconductor processing apparatus 100 may be optimized for performance in a specific processing operation without replacing or modifying the focus ring 170. Further, the cover ring 180 may be replaced or re-designed and replaced for processing of additional wafers in different operations.

Figure 3:
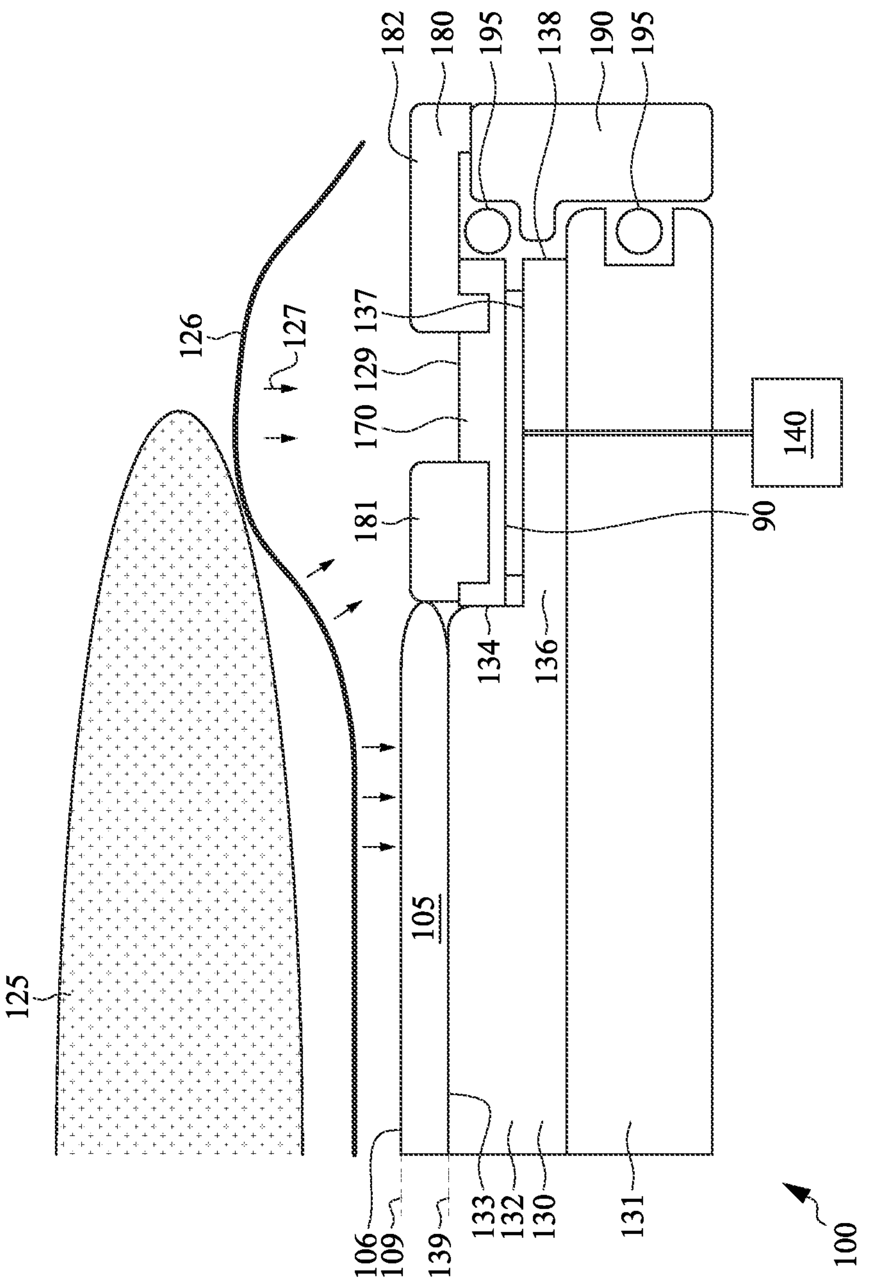
FIG. 3 is a schematic cross-sectional partial view that depicts more clearly the cover ring and focus ring in a semiconductor processing apparatus according to embodiments of the present disclosure.

Referring now to FIG. 3, a schematic cross-sectional partial view depicts more clearly the shape and size of a cover ring 180 and focus ring 170 in a semiconductor processing apparatus 100 according to embodiments of the present disclosure. Specifically, FIG. 3 focuses on one edge of a wafer 105 located on chuck 130 and the adjacent portion of the focus ring 170 and cover ring 180.

As shown in FIG. 3, the chuck 130 is positioned over, or includes, a base 131. Further, the chuck 130 has a central portion 132 with an upper surface 133 on which the wafer 105 is located, and an outer sidewall 134. Also, chuck 130 has an outer portion 136 that has an upper surface 137 and an outer sidewall 138.

In FIG. 3, an adhesive layer 90 is located on the upper surface 137 of the outer portion 136 of the chuck 130. Further, the focus ring 170 is fixed to the adhesive layer 90.

As shown, the semiconductor processing apparatus 100 further includes a support ring 190 located radially outward from the outer sidewall 138 of the chuck 130 and radially outward from the focus ring 170. Further, the semiconductor processing apparatus 100 includes conductive O-rings 195 located between the support ring 190 and the base 131 of the chuck 130 and focus ring 170.

In FIG. 3, the inner annular portion 181 of the cover ring 180 is located over the interface of the sidewall 134 of the central portion 132 of the chuck 130 with the focus ring 170. Further, the outer annular portion 182 of the cover ring 180 is located over the outer portion of the focus ring 170 and extends over the O-ring 195 and the support ring 190.

As configured, the cover ring 180 and focus ring 170 control the focus-ring exposure area 129 and electric field, which affects the plasma sheath 126 and direction of flow of ions 127.

In FIG. 3, the upper surface 133 of the electrostatic chuck 130 defines a plane 139. Further, the plane 139 extends through the inner annular portion 181 and the outer annular portion 182 of the cover ring 180, such that the plane 139 is located between the lower surface and the upper surface of each annular portion 181 and 182.

In FIG. 3, the wafer 105 has an upper surface 106. In some embodiments, upper surface 106 is substantially planar and defines a plane 109. As shown, the inner annular portion 181 and the outer annular portion 182 have uppermost surfaces that are located between the plane 109 and the electrostatic chuck 130, or are co-planar with the plane 109.

Figure 4:
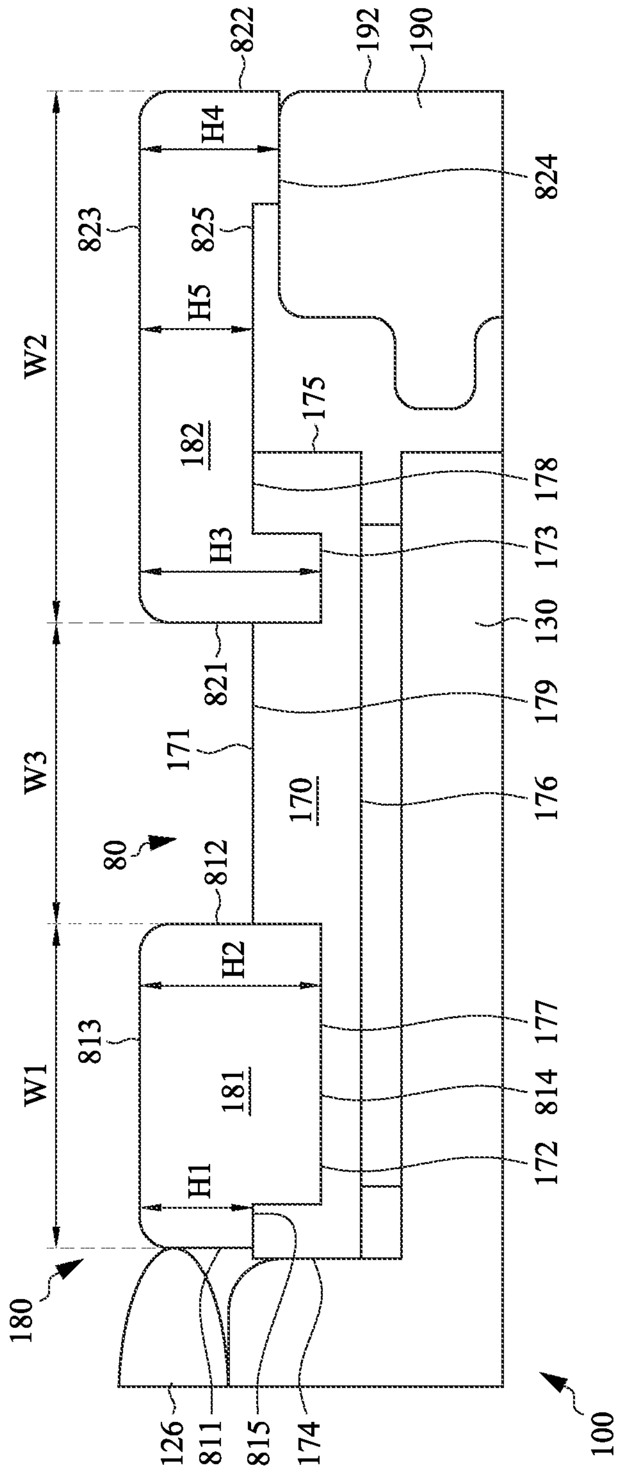
FIG. 4 is a schematic cross-sectional partial view focused on the cover ring and focus ring in a semiconductor processing apparatus according to embodiments of the present disclosure.

FIG. 4 provides a focused view of the focus ring 170 and cover ring 180 of the semiconductor processing apparatus 100. As shown, the focus ring 170 has an upper surface 171 formed with an inner annular groove 172 and an outer groove 173. In some embodiments, the upper surface 171 of the focus ring 170 is substantially planar and may be horizontal, i.e., perpendicular to the Z-axis. The focus ring 170 extends radially outward from an inner edge 174 to an outer edge 175. As shown, the focus ring 170 has a bottom surface 176 that may be adhered or otherwise fixed to the chuck 130.

Further, the upper surface 171 of the focus ring 170 includes an inner annular surface 177 abutting the inner edge 174, an outer annular surface 178 abutting the outer edge 175, and a middle annular surface 179 located between the inner annular surface 177 and the outer annular surface 178.

In FIG. 4, the inner annular portion 181 of the cover ring 180 extends radially outward from an inner edge 811 to an outer edge 812. Further, the inner annular portion 181 lies over the inner annular surface 177 of the focus ring 170. As shown, the inner annular portion 181 has an upper surface 813. In some embodiments, the upper surface 813 is substantially planar and may be horizontal, i.e., perpendicular to the Z-axis. As further shown, the inner annular portion has a bottom surface 814 that abuts the focus ring 170. In some embodiments, the inner annular portion 181 is formed with a groove 815. As shown, the groove 815 may be formed at the intersection of the inner annular edge 811 and the bottom surface 814. In some embodiments, the bottom surface 814 is substantially planar and may be horizontal, i.e., perpendicular to the Z-axis.

In FIG. 4, the inner annular portion 181 has a vertical height H1 from bottom surface 814 at groove 815 to upper surface 813, and has a vertical height H2 from bottom surface 814 to upper surface 813 adjacent the outer edge 812. In some embodiments, vertical height H1 is a minimum vertical height of the inner annular portion 181. In some embodiments, vertical height H2 is a maximum vertical height of the inner annular portion 181. In some embodiments, height H1 is from 1 to 15 millimeters (mm) and height H2 is from 1 to 30 millimeters (mm).

With the structure of the inner annular portion 181 and the focus ring 170, it may be seen that the inner annular portion 181 may sit in the inner annular groove 172 of the focus ring 170. Further, the inner annular portion 181 may extend over the inner edge 174 of the focus ring. In some embodiments, the inner edge 811 of the inner annular portion 181 may be aligned with the inner edge 174 of the focus ring.

In FIG. 4, the outer annular portion 182 of the cover ring 180 extends radially outward from an inner edge 821 to an outer edge 822. As shown, the outer annular portion 182 lies over the outer annular surface 178 of the focus ring 170. As shown, the outer annular portion 182 has an upper surface 823. In some embodiments, the upper surface 823 is substantially planar and may be horizontal, i.e., perpendicular to the Z-axis. As further shown, the inner annular portion has a bottom surface 824 that abuts the focus ring 170. In some embodiments, the outer annular portion 182 is formed with a groove 825. As shown, the groove 825 may be formed at the intersection of the inner annular edge 821 and the bottom surface 824. In some embodiments, the bottom surface 824 is substantially planar and may be horizontal, i.e., perpendicular to the Z-axis.

In FIG. 4, the outer annular portion 182 has a maximum vertical height H3 from bottom surface 824 to upper surface 823 adjacent the inner edge 821, has a minimum vertical height H5 from bottom surface 824 at groove 825 to upper surface 823, and has a vertical height H4 from bottom surface 824 to upper surface 823 adjacent the outer edge 822. In some embodiments, vertical height H5 is a minimum vertical height of the outer annular portion 182. In some embodiments, vertical height H3 is a maximum vertical height of the outer annular portion 182. In some embodiments, height H3 is from 1 to 30 millimeters (mm), height H4 is from 1 to 15 millimeters (mm), and height H5 is from 1 to 15 millimeters (mm).

With the structure of the outer annular portion 182 and the focus ring 170, it may be seen that the outer annular portion 182 may sit in the outer annular groove 173 of the focus ring 170. Further, the outer annular portion 182 may extend over the outer edge 175 of the focus ring 170. In some embodiments, the outer annular portion 182 extends over the support ring 190. In some embodiments, the outer edge 822 is aligned with the outer edge 192 of the support ring 190.

In FIG. 4, the inner annular portion 181 has a horizontal radial width W1 from inner edge 811 to outer edge 812, and the outer annular portion 182 has a horizontal radial width W2 from inner edge 821 to outer edge 822. In some embodiments, radial width W1 is from 1 to 92 millimeters (mm) and radial width W2 is from 1 to 92 millimeters (mm).

In FIG. 4, width W2 is greater than width W1. In some embodiments, a ratio of width W1 to width W2 is at least 1:8; at least 1:7; at least 1:6; at least 1:5; at least 1:4; at least 1:3; at least 1:2; at least 2:3; at least 3:4; at least 5:6; at least 1:1; at least 6:5; at least 4:3; at least 3:2; at least 2:1; at least 3:1; at least 4:1; at least 5:1; at least 6:1; at least 7:1; or at least 8:1. In some embodiments, a ratio of width W1 to width W2 is at most at most 1:8; at most 1:7; at most 1:6; at most 1:5; at most 1:4; at most 1:3; at most 1:2; at most 2:3; at most 3:4; at most 5:6; at most 1:1; at most 6:5; at most 4:3; at most 3:2; at most 2:1; at most 3:1; at most 4:1; at most 5:1; at most 6:1; at most 7:1; or at most 8:1.

Further, a gap 80 in the cover ring 180 is formed between the inner annular portion 181 and the outer annular portion 182. As shown, the gap 80 lies over the middle annular surface 179 of the focus ring 170. As shown, gap 80 has a radial distance or width W3. In some embodiments, radial width W3 is from 1 to 180 millimeters (mm).

Figure 7:
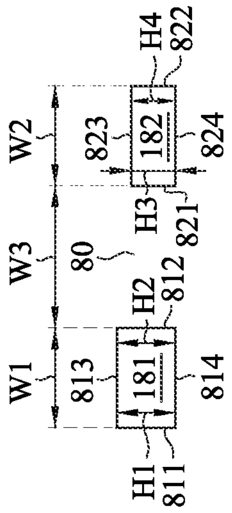
FIG. 7 is a cross-sectional view of the two-piece cover ring of FIG. 5, taken along line 7-7 in FIG. 5.
Figure 5:
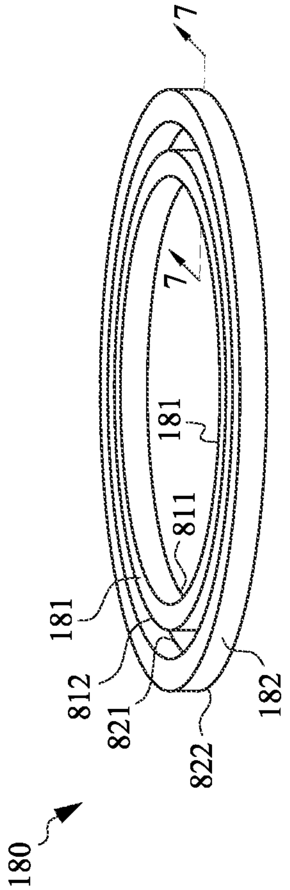
FIG. 5 is a perspective view of a two-piece cover ring according to embodiments of the present disclosure.
Figure 6:
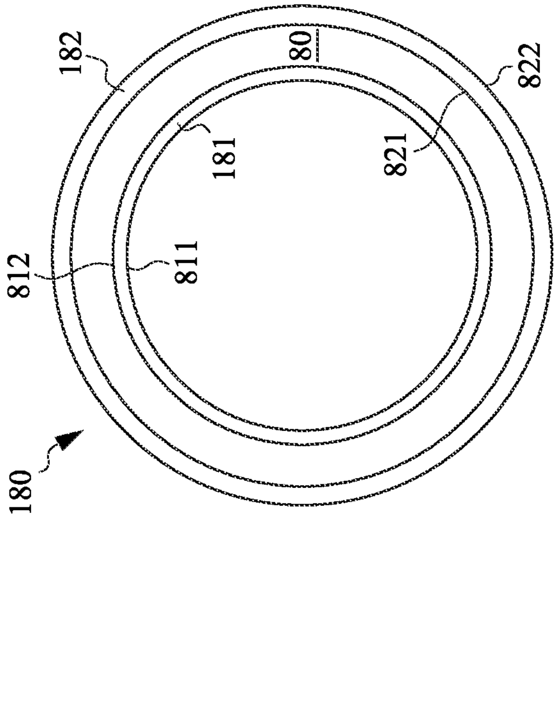
FIG. 6 is an overhead view of the two-piece cover ring of FIG. 5.

FIGS. 5-7 illustrate an embodiment of a cover ring 180 with two disconnected and separate annular portions 181 and 182. FIG. 5 is a perspective view, FIG. 6 is an overhead view, and FIG. 7 is a cross-section view taken along line 7-7 in FIG. 5.

As shown in FIGS. 5-7, the annular portions 181 and 182 may be substantially circular. Further, each annular portion 181 and 182 may have a substantially rectangular cross-section.

As shown, inner annular portion 181 has a substantially linear inner edge 811, substantially linear outer edge 812, substantially planar upper surface 813, and substantially planar bottom surface 814. Inner annular portion 181 has a vertical height H1 extending from bottom surface 814 to upper surface 813 adjacent inner edge 811 and has a vertical height H2 extending from bottom surface 814 to upper surface 813 adjacent outer edge 812. In FIGS. 5-7, inner edge 811 and outer edge 812 are substantially vertical and upper surface 813 and bottom surface 814 are substantially horizontal such that heights H1 and H2 are substantially equal.

As shown, outer annular portion 182 has a substantially linear inner edge 821, substantially linear outer edge 822, substantially planar upper surface 823, and substantially planar bottom surface 824. Outer annular portion 182 has a vertical height H3 extending from bottom surface 824 to upper surface 823 adjacent inner edge 821 and has a vertical height H4 extending from bottom surface 824 to upper surface 823 adjacent outer edge 822. In FIGS. 5-7, inner edge 821 and outer edge 822 are substantially vertical and upper surface 813 and bottom surface 814 are substantially horizontal such that heights H3 and H4 are substantially equal.

In some embodiments, the bottom surfaces 823 and 824 are co-planar and heights H1 and H2 are greater than heights H3 and H4 such that the upper surface 813 is located at a greater height over the focus ring than upper surface 814.

In FIGS. 5-7, inner edge 811 and outer edge 812 are distanced from one another by radial width W1, and inner edge 821 and outer edge 822 are distanced from one another by radial width W2. Further, outer edge 812 and inner edge 821 are distanced from one another by radial width W3.

In some embodiments, width W1, width W2, and width W3 are, independently, at least 1 mm, at least 2 mm, at least 5 mm, at least 10 mm, at least 15 mm, at least 20 mm, at least 25 mm, at least 30 mm, at least 35 mm, at least 40 mm, at least 45 mm, at least 50 mm, at least 55 mm, at least 60 mm, at least 65 mm, at least 70 mm, at least 75 mm, at least 80 mm, at least 85 mm, at least 90 mm. In some embodiments, width W1 and width W2 are, independently, at most 2 mm, at most 5 mm, at most 10 mm, at most 15 mm, at most 20 mm, at most 25 mm, at most 30 mm, at most 35 mm, at most 40 mm, at most 45 mm, at most 50 mm, at most 55 mm, at most 60 mm, at most 65 mm, at most 70 mm, at most 75 mm, at most 80 mm, at most 85 mm, at most 90 mm, or at most 92 mm.

In some embodiments, a ratio of width W1 to width W2 is at least 1:20; at least 1:10; at least 1:9; at least 1:8; at least 1:7; at least 1:6; at least 1:5; at least 1:4; at least 1:3; at least 1:2; at least 2:3; at least 3:4; at least 5:6; at least 1:1; at least 6:5; at least 4:3; at least 3:2; at least 2:1; at least 3:1; at least 4:1; at least 5:1; at least 6:1; at least 7:1; at least 8:1; at least 9:1; at least 10:1; or at least 20:1.

In some embodiments, a ratio of width W1 to width W2 is at most 1:20; at most 1:10; at most 1:9; at most 1:8; at most 1:7; at most 1:6; at most 1:5; at most 1:4; at most 1:3; at most 1:2; at most 2:3; at most 3:4; at most 5:6; at most 1:1; at most 6:5; at most 4:3; at most 3:2; at most 2:1; at most 3:1; at most 4:1; at most 5:1; at most 6:1; at most 7:1; at most 8:1; at most 9:1; at most 10:1; or at most 20:1.

In some embodiments, a ratio of width W1 to width W3 is at least 1:20; at least 1:10; at least 1:9; at least 1:8; at least 1:7; at least 1:6; at least 1:5; at least 1:4; at least 1:3; at least 1:2; at least 2:3; at least 3:4; at least 5:6; at least 1:1; at least 6:5; at least 4:3; at least 3:2; at least 2:1; at least 3:1; at least 4:1; at least 5:1; at least 6:1; at least 7:1; at least 8:1; at least 9:1; at least 10:1; or at least 20:1.

In some embodiments, a ratio of width W1 to width W3 is at most 1:20; at most 1:10; at most 1:9; at most 1:8; at most 1:7; at most 1:6; at most 1:5; at most 1:4; at most 1:3; at most 1:2; at most 2:3; at most 3:4; at most 5:6; at most 1:1; at most 6:5; at most 4:3; at most 3:2; at most 2:1; at most 3:1; at most 4:1; at most 5:1; at most 6:1; at most 7:1; at most 8:1; at most 9:1; at most 10:1; or at most 20:1.

In some embodiments, vertical height H1 and vertical height H4, are, independently at least 1 mm, at least 2 mm, at least 3 mm, at least 4 mm, at least 5 mm, at least 6 mm, at least 7 mm, at least 8 mm, at least 9 mm, at least 10 mm, at least 11 mm, at least 12 mm, at least 13 mm, or at least 14 mm. In some embodiments, vertical height H1 and vertical height H4, are, independently at most 2 mm, at most 3 mm, at most 4 mm, at most 5 mm, at most 6 mm, at most 7 mm, at most 8 mm, at most 9 mm, at most 10 mm, at most 11 mm, at most 12 mm, at most 13 mm, at most 14 mm, or at most 15 mm.

In some embodiments, vertical height H2 and vertical height H3, are, independently at least 1 mm, at least 2 mm, at least 3 mm, at least 4 mm, at least 5 mm, at least 6 mm, at least 7 mm, at least 8 mm, at least 9 mm, at least 10 mm, at least 11 mm, at least 12 mm, at least 13 mm, at least 14 mm, at least 15 mm, at least 16 mm, at least 17 mm, at least 18 mm, at least 19 mm, at least 20 mm, at least 21 mm, at least 22 mm, at least 23 mm, at least 24 mm, at least 25 mm, at least 26 mm, at least 27 mm, at least 28 mm, or at least 29 mm. In some embodiments, vertical height H2 and vertical height H3, are, independently at most 2 mm, at most 3 mm, at most 4 mm, at most 5 mm, at most 6 mm, at most 7 mm, at most 8 mm, at most 9 mm, at most 10 mm, at most 11 mm, at most 12 mm, at most 13 mm, at most 14 mm, at most 15 mm, at most 16 mm, at most 17 mm, at most 18 mm, at most 19 mm, at most 20 mm, at most 21 mm, at most 22 mm, at most 23 mm, at most 24 mm, at most 25 mm, at most 26 mm, at most 27 mm, at most 28 mm, at most 29 mm, or at most 30 mm.

Figure 8:
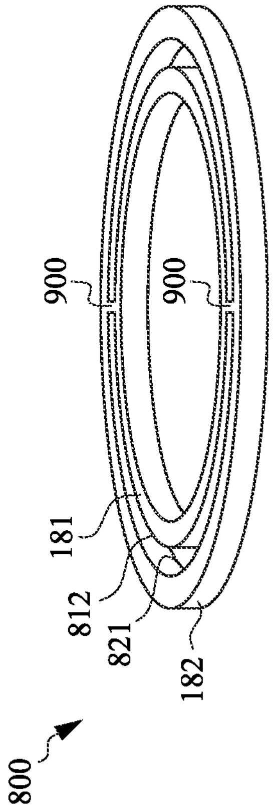
FIG. 8 is a perspective view of a one-piece cover ring according to embodiments of the present disclosure.
Figure 9:
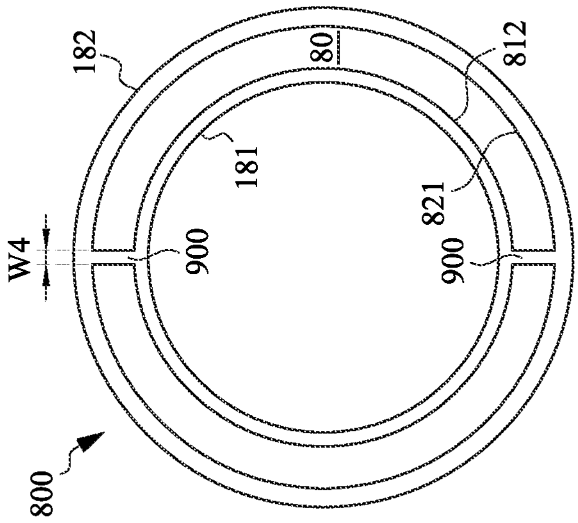
FIG. 9 is an overhead view of the one-piece cover ring of FIG. 8.

FIGS. 8-9 illustrate an embodiment of a cover ring 180 with annular portions 181 and 182 that are interconnected by bridge portions 900. FIG. 8 is a perspective view and FIG. 9 is an overhead view.

In FIGS. 8-9, at least one bridge portion 900 extends between and interconnects the outer edge 812 of the inner annular portion 181 and the inner edge 821 of the outer annular portion 182. In exemplary embodiments, each bridge portion 900 extends radially from the outer edge 812 to the inner edge 821.

While two bridge portions 900 are illustrated, the cover ring 180 may include any suitable number of bridge portions 900. In some embodiments, the cover ring 180 has from one to thirty-two bridge portions 900. In some embodiments, the bridge portions 900 are equidistantly spaced around the circumference of the cover ring 180.

In some embodiments, the bridge portions 900 are insulative. For example, the bridge portions may be a ceramic material such as quartz, alumina, silicon nitride, or other suitable material. In some embodiments, the bridge portions 900, the inner annular portion 181, and the outer annular portion 182 are formed as a single piece, i.e., are monolithic. In some embodiments, the bridge portions 900 are conductive. For example, the bridge portions may be a metal material, a semiconductor material such as doped or undoped silicon, or another material.

Figure 10:
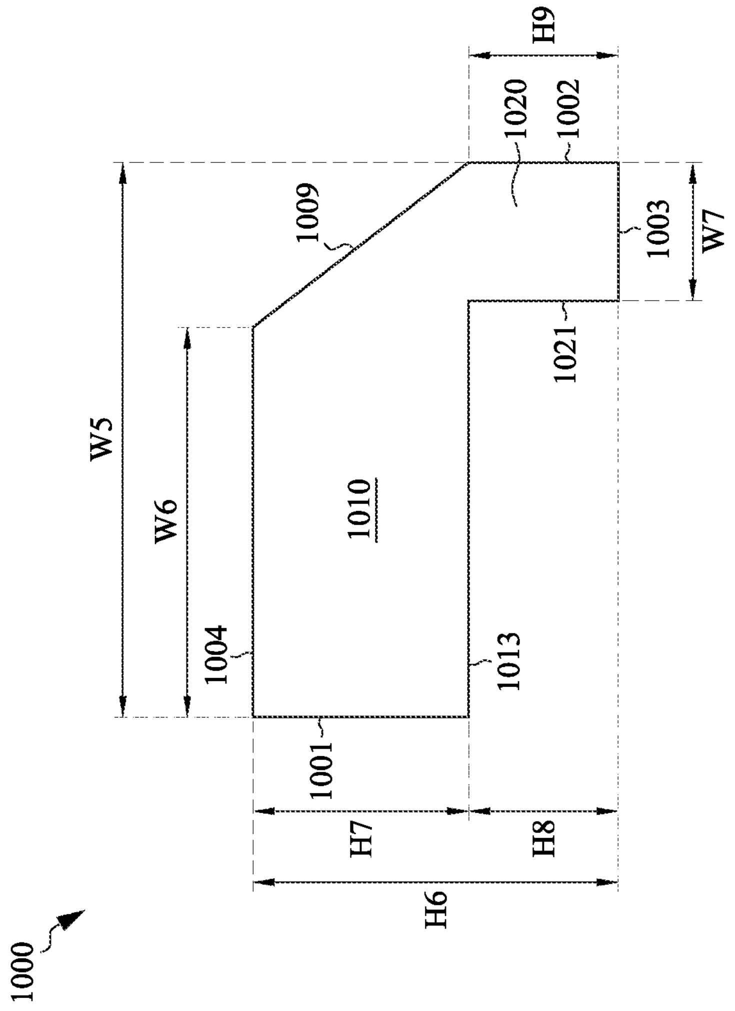
FIG. 10 is a cross-sectional view of an annular portion of a cover ring, taken along line 7-7 in FIG. 5, according to embodiments of the present disclosure.

FIG. 10 provides a cross-sectional view of either inner annular portion 181 or outer annular portion 182, individually referred to as annular portion 1000, taken along line 7-7 in FIG. 5. In FIG. 10, the annular portion 1000 extends from a first annular edge 1001 to a second annular edge 1002 along a total radial width W5. In some embodiments, the first edge 1001 is an inner annular edge and the second edge 1002 is an outer annular edge.

As shown, the annular portion 1000 extends from a bottom surface 1003 to a upper surface 1004 along a total vertical height H6. In some embodiments, height H6 may be from 1 mm to 30 mm, such as within the ranges disclosed above for height H2 or H3.

As shown, the annular portion 1000 has a concave polygon shape and includes an upper portion 1010 and a lower portion 1020. The upper portion 1010 extends downward from the upper surface 1004 to a surface 1013 along a vertical height H7. Thus, first edge 1001 may have a length equal to vertical height H7. Also, the upper portion 1010 extends inward from edge 1001 to surface 1021.

Lower portion 1020 extends inward from edge 1002 to surface 1021 along a radial width W7. Thus, bottom surface 1003 may have a length equal to radial width W7. Further, lower portion 1020 extends upward from surface 1003 to surface 1013 along vertical height H8. Thus, surface 1021 may have a length equal to height H8.

As further shown, annular portion 1000 includes an angled surface 1009 that interconnects edge 1002 and upper surface 1004. Edge 1002 extends from surface 1003 to angled surface 1009 along a vertical height H9. Surface 1004 extends from edge 1001 to angled surface 1009 along a radial width W6.

As shown, total height H6 is equal to the sum of height H7 and height H8. In some embodiments, a ratio of height H7 to height H8 is at least 1:8; at least 1:7; at least 1:6; at least 1:5; at least 1:4; at least 1:3; at least 1:2; at least 2:3; at least 3:4; at least 5:6; at least 1:1; at least 6:5; at least 4:3; at least 3:2; at least 2:1; at least 3:1; at least 4:1; at least 5:1; at least 6:1; at least 7:1; or at least 8:1. In some embodiments, a ratio of height H7 to height H8 is at most at most 1:8; at most 1:7; at most 1:6; at most 1:5; at most 1:4; at most 1:3; at most 1:2;

at most 2:3; at most 3:4; at most 5:6; at most 1:1; at most 6:5; at most 4:3; at most 3:2; at most 2:1; at most 3:1; at most 4:1; at most 5:1; at most 6:1; at most 7:1; or at most 8:1.

In FIG. 10, width W7 is less than height H7. In some embodiments, a ratio of width W7 to height H7 is at least 1:8; at least 1:7; at least 1:6; at least 1:5; at least 1:4; at least 1:3; at least 1:2; at least 2:3; at least 3:4; at least 5:6; at least 1:1; at least 6:5; at least 4:3; at least 3:2; at least 2:1; at least 3:1; at least 4:1; at least 5:1; at least 6:1; at least 7:1; or at least 8:1. In some embodiments, a ratio of width W7 to height H7 is at most at most 1:8; at most 1:7; at most 1:6; at most 1:5; at most 1:4; at most 1:3; at most 1:2; at most 2:3; at most 3:4; at most 5:6; at most 1:1; at most 6:5; at most 4:3; at most 3:2; at most 2:1; at most 3:1; at most 4:1; at most 5:1; at most 6:1; at most 7:1; or at most 8:1.

In FIG. 10, height H9 is greater than height H8. In some embodiments, a ratio of height H8 to height H9 is at least 1:8; at least 1:7; at least 1:6; at least 1:5; at least 1:4; at least 1:3; at least 1:2; at least 2:3; at least 3:4; at least 5:6; at least 1:1; at least 6:5; at least 4:3; at least 3:2; at least 2:1; at least 3:1; at least 4:1; at least 5:1; at least 6:1; at least 7:1; or at least 8:1. In some embodiments, a ratio of height H8 to height H9 is at most at most 1:8; at most 1:7; at most 1:6; at most 1:5; at most 1:4; at most 1:3; at most 1:2; at most 2:3; at most 3:4; at most 5:6; at most 1:1; at most 6:5; at most 4:3; at most 3:2; at most 2:1; at most 3:1; at most 4:1; at most 5:1; at most 6:1; at most 7:1; or at most 8:1.

In FIG. 10, width W6 is greater than width W7. In some embodiments, a ratio of width W6 to width W7 is at least 1:8; at least 1:7; at least 1:6; at least 1:5; at least 1:4; at least 1:3; at least 1:2; at least 2:3; at least 3:4; at least 5:6; at least 1:1; at least 6:5; at least 4:3; at least 3:2; at least 2:1; at least 3:1; at least 4:1; at least 5:1; at least 6:1; at least 7:1; or at least 8:1. In some embodiments, a ratio of width W6 to width W7 is at most at most 1:8; at most 1:7; at most 1:6; at most 1:5; at most 1:4; at most 1:3; at most 1:2; at most 2:3; at most 3:4; at most 5:6; at most 1:1; at most 6:5; at most 4:3; at most 3:2; at most 2:1; at most 3:1; at most 4:1; at most 5:1; at most 6:1; at most 7:1; or at most 8:1.

In FIG. 10, total width W5 is greater than total height H6. In some embodiments, a ratio of width W5 to height H6 is at least 1:8; at least 1:7; at least 1:6; at least 1:5; at least 1:4; at least 1:3; at least 1:2; at least 2:3; at least 3:4; at least 5:6; at least 1:1; at least 6:5; at least 4:3; at least 3:2; at least 2:1; at least 3:1; at least 4:1; at least 5:1; at least 6:1; at least 7:1; or at least 8:1. In some embodiments, a ratio of width W5 to height H6 is at most at most 1:8; at most 1:7; at most 1:6; at most 1:5; at most 1:4; at most 1:3; at most 1:2; at most 2:3; at most 3:4; at most 5:6; at most 1:1; at most 6:5; at most 4:3; at most 3:2; at most 2:1; at most 3:1; at most 4:1; at most 5:1; at most 6:1; at most 7:1; or at most 8:1.

In some embodiments, the lower portion 1020 of the annular portion 1000 sits within a groove formed in a focus ring 170, or sits outside, e.g., against an outer edge of, a focus ring 170.

In some embodiments, the apparatus and components of FIGS. 1-10 are configured to hold and process a wafer 105 having a diameter of 100 mm, 150 mm, 200 mm, or 300 mm, or other desired diameter.

As described herein, the cover ring 180 is provided with an annular gap 80 having a desired width W3. The gap 80 extends from outer edge 812 of an inner annular portion 181 having a desired height H2 to an inner edge 821 of an outer annular portion 182 having desired height H3. The inner annular portion 181 has an inner edge 811 with a desired height H1 and the outer annular portion 182 has an outer edge 822 with a desired height H4. Each dimension of the cover ring 180 may be optimized to provide a desired focus-ring exposure area 129 and electric field, to affect the plasma sheath 126 and modify the direction of flow of ions 127. As a result, the cover ring 180 may reduce or eliminate the tilting angle problem and the via-to-metal overlap, particularly at the wafer radius of 130 to 145 mm of a wafer having a radius of 150 mm.

Thus, one of the embodiments of the present disclosure describes an etching apparatus including a chamber configured to receive a wafer for an etching process; a conductive focus ring disposed within the chamber and configured to focus an electric field to control an etch direction of the etching process; and an insulative cover ring disposed within the chamber, wherein the insulative cover ring is configured to modify the electric field, wherein the insulative cover ring has an inner annular insulative portion and outer annular insulative portion, and wherein a gap is defined between the inner annular insulative portion and the outer annular insulative portion.

In some embodiments of the apparatus, the conductive focus ring has an inner annular surface abutting an inner edge, an outer annular surface abutting an outer edge, and a central annular surface between the inner annular surface and the outer annular surface; the inner annular insulative portion lies over the inner annular surface; and the outer annular insulative portion lies over the outer annular surface.

In some embodiments of the apparatus, the outer annular insulative portion extends radially beyond the outer edge.

In some embodiments of the apparatus, the inner annular insulative portion has a radial width of from 1 to 92 millimeters (mm); and the outer annular insulative portion has a radial width of from 1 to 92 millimeters (mm).

In some embodiments of the apparatus, the inner annular insulative portion has an inner edge with a vertical height of from 1 to 15 millimeters (mm); the inner annular insulative portion has an outer edge with a vertical height of from 1 to 30 millimeters (mm); the outer annular insulative portion has an inner edge with a vertical height of from 1 to 30 millimeters (mm); and the outer annular insulative portion has an outer edge with a vertical height of from 1 to 15 millimeters (mm).

In some embodiments of the apparatus, the insulative cover ring further includes bridge portions interconnecting the inner annular insulative portion and the outer annular insulative portion, wherein the bridge portions are insulative.

In some embodiments of the apparatus, the insulative cover ring further includes bridge portions interconnecting the inner annular insulative portion and the outer annular insulative portion, wherein the bridge portions are conductive.

In some embodiments of the apparatus, the inner annular insulative portion and outer annular insulative portion are disconnected and independent of one another.

In another embodiment of the present disclosure, a plasma etching apparatus is provided and includes a chamber; an electrostatic chuck disposed within the chamber, the chuck being configured to hold a wafer during a plasma etching process performed on the wafer; a focus ring disposed within the chamber and surrounding a portion of the chuck, wherein the focus ring has an inner portion abutting an inner edge of the focus ring and has an outer portion abutting an outer edge of the focus ring; an inner shield located over the inner portion of the focus ring; and an outer shield located over the outer portion of the focus ring.

In some embodiments of the plasma etching apparatus, the focus ring is configured to control a direction of ions of the plasma etching process; and the inner shield and the outer shield are configured to modify control of the direction of ions of the plasma etching process.

In some embodiments of the plasma etching apparatus, each shield has a lower surface and an upper surface, wherein the electrostatic chuck has an upper surface defining a plane, and wherein the plane is located between the lower surface and the upper surface of each shield.

In some embodiments of the plasma etching apparatus, the electrostatic chuck is configured to hold the wafer during a plasma etching process performed on the wafer such that an upper surface of the wafer is at a first plane, and wherein the inner shield and the outer shield have uppermost surfaces that are located between the plane and the electrostatic chuck, or are co-planar with the plane.

In some embodiments of the plasma etching apparatus, the outer shield extends radially beyond the outer edge.

In some embodiments of the plasma etching apparatus, the inner shield has a radial width of from 1 to 92 millimeters (mm); and the outer shield has a radial width of from 1 to 92 millimeters (mm).

In some embodiments of the plasma etching apparatus, the inner shield has an inner edge with a vertical height of from 1 to 15 millimeters (mm); the inner shield has an outer edge with a vertical height of from 1 to 30 millimeters (mm); the outer shield has an inner edge with a vertical height of from 1 to 30 millimeters (mm); and the outer shield has an outer edge with a vertical height of from 1 to 15 millimeters (mm).

In some embodiments, the plasma etching apparatus further includes bridges interconnecting the inner shield and the outer shield, wherein the bridges are insulative.

In some embodiments, the plasma etching apparatus further includes bridges interconnecting the inner shield and the outer shield, wherein the bridges are conductive.

In some embodiments of the plasma etching apparatus, the inner shield and outer shield are disconnected and independent of one another.

In another embodiment of the present disclosure, a method for plasma processing is provided and includes locating a wafer on an electrostatic chuck disposed within a plasma chamber, wherein a focus ring surrounds a portion of the chuck, and wherein a cover ring lies over the focus ring; igniting a plasma within the chamber; directing a direction of ion flow toward the wafer by biasing the focus ring with a DC power source to form an electrical field; and modifying the electrical field with the cover ring, wherein an inner portion of the focus ring is blocked by the cover ring, a middle portion of the focus ring is unblocked by the cover ring, and an outer portion of the focus ring is blocked by the cover ring.

In some embodiments of the method, the inner portion of the focus ring is blocked by an inner annular portion of the cover ring; and the outer portion of the focus ring is blocked by an outer annular portion of the cover ring.

In some embodiments of the method, a middle portion of the focus ring is unblocked by the cover ring.

In some embodiments, the method, further includes determining a design of the cover ring to modify the electrical field of the focus ring to reduce or eliminate via tilting.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A plasma processing apparatus comprising:

a chamber configured to receive a wafer for an etching process;

a conductive focus ring disposed within the chamber and configured to focus an electric field to control an etch direction of the etching process; and an insulative cover ring disposed within the chamber, wherein the insulative cover ring is configured to modify the electric field, wherein the insulative cover ring has an inner annular insulative portion and outer annular insulative portion, and wherein a gap is defined between the inner annular insulative portion and the outer annular insulative portion.

2. The plasma processing apparatus of claim 1, wherein:

the conductive focus ring has an inner annular surface abutting an inner edge, an outer annular surface abutting an outer edge, and a central annular surface between the inner annular surface and the outer annular surface;

the inner annular insulative portion lies over the inner annular surface; and the outer annular insulative portion lies over the outer annular surface.

3. The plasma processing apparatus of claim 2, wherein the outer annular insulative portion extends radially beyond the outer edge.

4. The plasma processing apparatus of claim 1, wherein:

the inner annular insulative portion has a radial width of from 1 to 92 millimeters (mm); and the outer annular insulative portion has a radial width of from 1 to 92 millimeters (mm).

5. The plasma processing apparatus of claim 1, wherein:

the inner annular insulative portion has an inner edge with a vertical height of from 1 to 15 millimeters (mm);

the inner annular insulative portion has an outer edge with a vertical height of from 1 to 30 millimeters (mm);

the outer annular insulative portion has an inner edge with a vertical height of from 1 to 30 millimeters (mm); and the outer annular insulative portion has an outer edge with a vertical height of from 1 to 15 millimeters (mm).

6. The plasma processing apparatus of claim 1, wherein the insulative cover ring further comprises bridge portions interconnecting the inner annular insulative portion and the outer annular insulative portion, wherein the bridge portions are insulative.

7. The plasma processing apparatus of claim 1, wherein the insulative cover ring further comprises bridge portions interconnecting the inner annular insulative portion and the outer annular insulative portion, wherein the bridge portions are conductive.

8. The plasma processing apparatus of claim 1, wherein the inner annular insulative portion and outer annular insulative portion are disconnected and independent of one another.

9. The plasma processing apparatus of claim 1, wherein an inner portion of the conductive focus ring is blocked by the inner annular insulative portion, a middle portion of the conductive focus ring is unblocked by the insulative cover ring, and an outer portion of the conductive focus ring is blocked by the outer annular insulative portion.

10. The plasma processing apparatus of claim 9, wherein a middle portion of the conductive focus ring is unblocked by the insulative cover ring.

11. The plasma processing apparatus of claim 1, wherein the insulative cover ring further comprises bridge portions interconnecting the inner annular insulative portion and the outer annular insulative portion, wherein the bridge portions are insulative.

12. The plasma processing apparatus of claim 1, wherein the outer annular insulative portion extends from a first annular edge to a second annular edge, wherein the outer annular insulative portion has an upper surface, and wherein the outer annular insulative portion has an angled surface that interconnects the second annular edge and the upper surface.

13. A plasma processing apparatus comprising:

a chamber;

an electrostatic chuck disposed within the chamber, the electrostatic chuck being configured to hold a wafer during a plasma processing process performed on the wafer;

a focus ring disposed within the chamber and surrounding a portion of the electrostatic chuck, wherein the focus ring has an inner portion abutting an inner edge of the focus ring and has an outer portion abutting an outer edge of the focus ring;

an inner shield located over the inner portion of the focus ring; and an outer shield located over the outer portion of the focus ring.

14. The plasma processing apparatus of claim 13, wherein:

the focus ring is configured to control a direction of ions of the plasma processing process; and the inner shield and the outer shield are configured to modify control of the direction of ions of the plasma processing process.

15. The plasma processing apparatus of claim 13, wherein each shield has a lower surface and an upper surface, wherein the electrostatic chuck has an upper surface defining a plane, and wherein the plane is located between the lower surface and the upper surface of each shield.

16. The plasma processing apparatus of claim 13, wherein the electrostatic chuck is configured to hold the wafer during a plasma processing process performed on the wafer such that an upper surface of the wafer is at a first plane, and wherein the inner shield and the outer shield have uppermost surfaces that are located between the first plane and the electrostatic chuck, or are co-planar with the first plane.

17. The plasma processing apparatus of claim 13, wherein the outer shield extends radially beyond the outer edge.

18. The plasma processing apparatus of claim 13, wherein:

the inner shield has an inner edge with a vertical height of from 1 to 15 millimeters (mm);

the inner shield has an outer edge with a vertical height of from 1 to 30 millimeters (mm);

the outer shield has an inner edge with a vertical height of from 1 to 30 millimeters (mm); and the outer shield has an outer edge with a vertical height of from 1 to 15 millimeters (mm).

19. The plasma processing apparatus of claim 13, further comprising bridges interconnecting the inner shield and the outer shield, wherein the bridges are insulative.

20. The plasma processing apparatus of claim 13, wherein the inner shield and outer shield are disconnected and independent of one another.

* * * * *